(12) United States Patent
Verbruggen et al.

(10) Patent No.: US 11,923,856 B2
(45) Date of Patent: Mar. 5, 2024

(54) LOW-LATENCY TIME-TO-DIGITAL CONVERTER WITH REDUCED QUANTIZATION STEP

(71) Applicant: XILINX, INC., San Jose, CA (US)

(72) Inventors: Bob W. Verbruggen, Dublin (IE); Christophe Erdmann, Nice (FR)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/713,901

(22) Filed: Apr. 5, 2022

(65) Prior Publication Data
US 2023/0318591 A1    Oct. 5, 2023

(51) Int. Cl.
*H03K 5/00* (2006.01)
*H03K 5/135* (2006.01)
*H03K 5/14* (2014.01)
*H03K 5/15* (2006.01)
*H03K 19/0948* (2006.01)
*H03M 1/82* (2006.01)

(52) U.S. Cl.
CPC ............... *H03K 5/14* (2013.01); *H03K 5/135* (2013.01); *H03K 5/15066* (2013.01); *H03K 19/0948* (2013.01); *H03M 1/82* (2013.01); *H03K 2005/00026* (2013.01)

(58) Field of Classification Search
CPC ......... H03K 2005/00026; H03K 5/135; H03K 5/14; H03K 5/15066; H03M 1/82
See application file for complete search history.

(56) References Cited

U.S. PATENT DOCUMENTS

| | | | | |
|---|---|---|---|---|
| 2007/0085570 A1* | 4/2007 | Matsuta | .................. | H03L 7/087 327/3 |
| 2007/0273569 A1* | 11/2007 | Lin | ........................ | G04F 10/005 341/155 |
| 2009/0225631 A1* | 9/2009 | shimizu | .................. | G04F 10/06 368/113 |
| 2009/0296532 A1* | 12/2009 | Hsieh | .................... | G04F 10/005 368/120 |

(Continued)

OTHER PUBLICATIONS

T. E. Rahkonen et al., "The use of stabilized CMOS delay lines for the digitization of short time intervals," in IEEE Journal of Solid-State Circuits, vol. 28, No. 8, pp. 887-894, Aug. 1993.

(Continued)

*Primary Examiner* — Tuan T Lam
(74) *Attorney, Agent, or Firm* — Patterson + Sheridan, LLP

(57) ABSTRACT

Methods and apparatus for time-to-digital conversion. An example apparatus includes a first input; a second input; a delay line coupled to the first input and comprising a plurality of first delay elements coupled in series, each of the plurality of first delay elements having a first delay time; a second delay element having an input coupled to the second input and having the first delay time; a third delay element having an input coupled to the second input and having a second delay time, the second delay time being smaller than the first delay time; a first set of arbiters having first inputs coupled to the delay line and having second inputs coupled to an output of the second delay element; and a second set of arbiters having first inputs coupled to the delay line and having second inputs coupled to an output of the third delay element.

19 Claims, 9 Drawing Sheets

(56) References Cited

U.S. PATENT DOCUMENTS

| | | | | |
|---|---|---|---|---|
| 2012/0069884 A1* | 3/2012 | Sakurai | .................. | H03L 7/091 |
| | | | | 375/224 |
| 2012/0104259 A1* | 5/2012 | Mann | .................... | G04F 10/005 |
| | | | | 250/361 R |
| 2012/0313803 A1* | 12/2012 | Dosho | .................. | G04F 10/005 |
| | | | | 341/166 |
| 2017/0373698 A1* | 12/2017 | Yan | ....................... | H03M 1/002 |
| 2021/0373503 A1* | 12/2021 | Morino | ................. | G04F 10/005 |

OTHER PUBLICATIONS

A. Ravi et al., "A 9.2-12GHz, 90nm digital fractional-N synthesizer with stochastic TDC calibration and -35/-41dBc integrated phase noise in the 5/2.5GHz bands," 2010 Symposium on VLSI Circuits, 2010, pp. 143-144.

* cited by examiner

LOW-LATENCY TIME-TO-DIGITAL CONVERTER WITH REDUCED QUANTIZATION STEP

TECHNICAL FIELD

Examples of the present disclosure generally relate to electronic circuits and, more particularly, to time-to-digital converters (TDCs).

BACKGROUND

Many electronic devices receive or sense an analog signal and convert the analog signal to a digital signal for further signal processing, control signal generation, and/or interpretation in the digital domain, such as by a processor or microcontroller. An analog-to-digital converter (ADC) may be used to convert such an analog signal to a digital signal. Several types of ADCs are available, each with varying advantages and disadvantages. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption. Yet another type of ADC gaining popularity is a time-based ADC. Contemporary time-based ADCs may be extremely competitive with and, in some cases, may significantly outperform conventional ADC architectures in some applications.

A time-based ADC may include a voltage-to-time converter and a time-to-digital converter (TDC). In addition to time-based ADCs, TDCs are also widely used in time-of-flight measurements and phase-locked loops (PLLs), for example. Some design considerations for TDCs include time resolution (the size of the time difference that results in a one least-significant bit (LSB) difference at the output), linearity (how linearly the output digital code represents the input time difference), and latency (how long it takes to generate a digital code).

SUMMARY

Examples of the present disclosure generally relate to architectures for time-to-digital converters (TDCs) with low latency, good time resolution, good linearity, and/or reduced power and area consumption. The TDCs of the present disclosure may include multiple stop lines with different delays, and multiple sets of arbiters for comparing various delayed signals.

An example of the present disclosure is directed to a TDC. The TDC generally includes a first input; a second input; a first delay line coupled to the first input and including a plurality of first delay elements coupled in series, each of the plurality of first delay elements having a first delay time; a second delay line coupled to the second input and including a second delay element having the first delay time; a third delay line coupled to the second input and including a third delay element having a second delay time, the second delay time being smaller than the first delay time; a first set of arbiters having first inputs coupled to the first delay line and having second inputs coupled to the second delay line; and a second set of arbiters having first inputs coupled to the first delay line and having second inputs coupled to the third delay line.

Another example of the present disclosure is directed to a TDC. The TDC generally includes a first input; a second input; a delay line coupled to the first input and comprising a plurality of first delay elements coupled in series, each of the plurality of first delay elements having a delay time; a plurality of second delay elements having a first output, a second output, and at least one input coupled to the second input; a first set of arbiters having first inputs coupled to the delay line and having second inputs coupled to the first output of the plurality of second delay elements; and a second set of arbiters having first inputs coupled to the delay line and having second inputs coupled to the second output of the plurality of second delay elements. For some examples, a delay difference between the first output and the second output of the plurality of second delay elements is one-half of the delay time.

Yet another example of the present disclosure is directed to a TDC. The TDC generally includes a first input; a second input; a delay line coupled to the first input and comprising a plurality of first delay elements coupled in series, each of the plurality of first delay elements having a first delay time; a second delay element having the first delay time and coupled to the second input; a third delay element having a second delay time and coupled to the second input, the second delay time being smaller than the first delay time; a first set of arbiters having first inputs coupled to the delay line and having second inputs coupled to the second delay element; and a second set of arbiters having first inputs coupled to the delay line and having second inputs coupled to the third delay element.

Yet another example of the present disclosure is directed to a time-based analog-to-digital converter (ADC). The time-based ADC generally includes a voltage-to-time converter (VTC) and a TDC (as described herein) coupled to the VTC. For some examples, a differential output pair of the VTC may be coupled to the first input and the second input of the TDC.

Yet another example of the present disclosure is directed to a programmable integrated circuit (IC). The programmable IC generally includes a VTC and a TDC (as described herein) coupled to the VTC. For some examples, the programmable IC includes a time-based ADC, which may include the VTC and the TDC. For some examples, a differential output pair of the VTC may be coupled to the first input and the second input of the TDC.

Yet another example of the present disclosure is directed to a device comprising the TDC (as described herein).

Yet another example of the present disclosure is directed to a method of time-to-digital conversion. The method generally includes delaying a first signal with a first delay line comprising a plurality of first delay elements coupled in series, each of the plurality of first delay elements having a first delay time; delaying a second signal with a second delay line comprising a second delay element having the first delay time; delaying the second signal with a third delay line comprising a third delay element having a second delay time, the second delay time being smaller than the first delay time; comparing delayed versions of the first signal on the first delay line with a first delayed version of the second signal on the second delay line; comparing the delayed versions of the first signal on the first delay line with a second delayed version of the second signal on the third delay line; and outputting a digital signal representing a time difference between the first signal and the second signal, based on the comparisons.

Yet another example of the present disclosure is directed to a method of time-to-digital conversion. The method generally includes delaying a first signal with a delay line comprising a plurality of first delay elements coupled in series, each of the plurality of first delay elements having a first delay time; delaying a second signal with a second delay element having the first delay time; delaying the second signal with a third delay element having a second delay time, the second delay time being smaller than the first delay time; comparing delayed versions of the first signal on the delay line with a first delayed version of the second signal from the second delay element; comparing the delayed versions of the first signal on the delay line with a second delayed version of the second signal from the third delay element; and outputting a digital signal representing a time difference between the first signal and the second signal, based on the comparisons.

These and other aspects may be understood with reference to the following

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Figure 1:
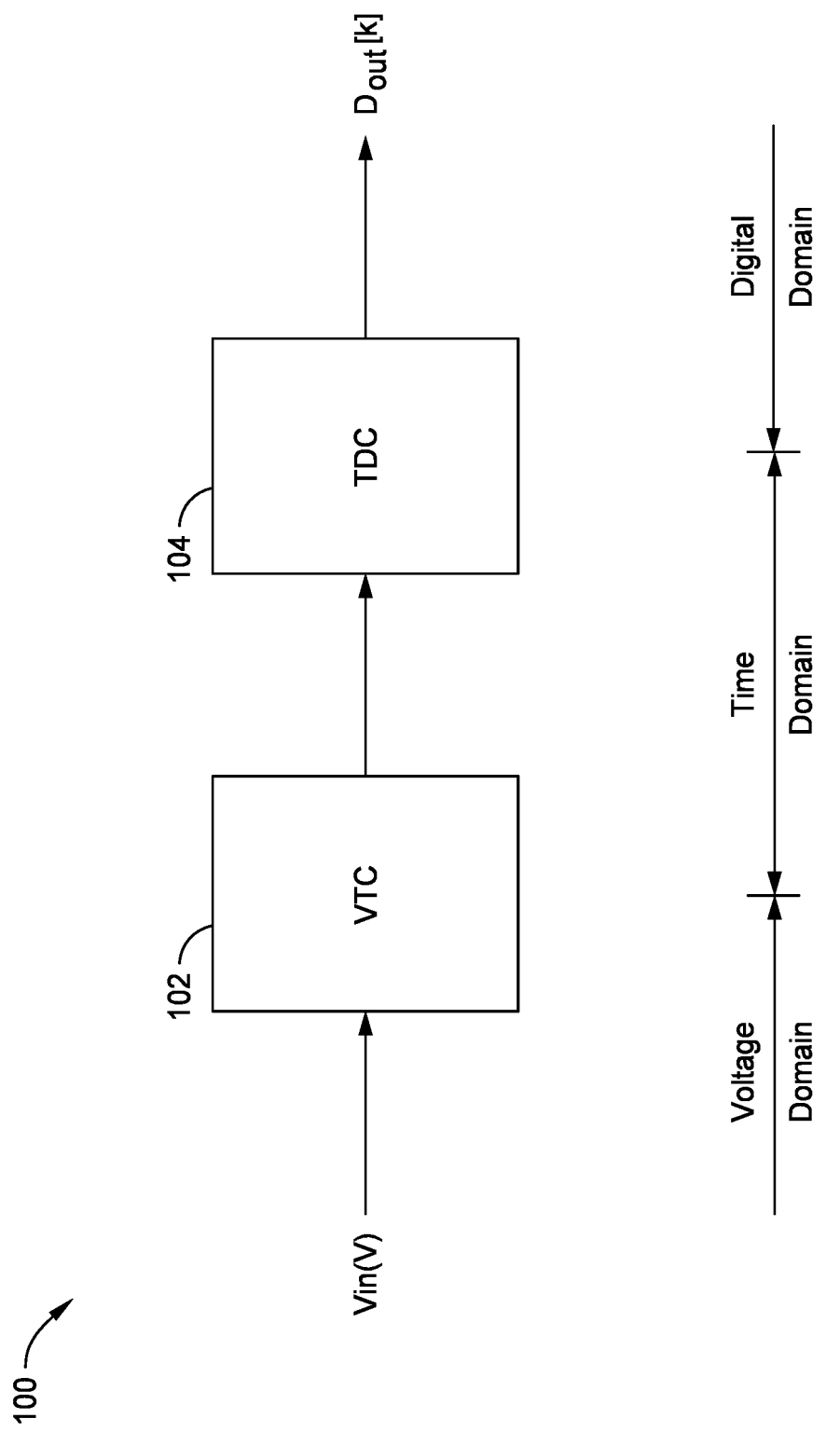
FIG. 1 is a block diagram of an example time-based analog-to-digital converter with a voltage-to-time converter (VTC) and a time-to-digital converter (TDC), in which some examples of the present disclosure may be practiced.

Examples of the present disclosure provide architectures for time-to-digital converters (TDCs) with low latency, good time resolution, good linearity, and/or reduced power and area consumption. For example, the TDCs of the present disclosure may have multiple stop lines with different delays, and multiple sets of arbiters for comparing various delayed signals.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example Time-Based ADC

Many analog circuit blocks (which represent information in voltage or current) suffer from scaling as various semiconductor processes are capable of producing smaller and smaller transistors. This performance degradation also applies to many types of conventional voltage-based analog-to-digital converters (ADCs) Therefore, other ADC architectures are being explored, which are designed to minimize, or at least reduce, analog circuitry reliance, replace high-accuracy and/or high-linearity circuits with those of adequate performance, and correct for such inaccuracies in the digital domain. ADC architectures designed with this approach may then benefit from scaling. One such type of ADC architecture is a time-based ADC, in which analog information is represented with a time-based quantity, such as a pulse width. Analog processing using time may enjoy the benefits of scaling due to the inherently higher resolution in time in state-of-the-art CMOS process nodes.

FIG. 1 is a block diagram of an example time-based ADC 100, in which some examples of the present disclosure may be practiced. In a time-based ADC, an analog input voltage (labeled "Vin(V)") is first converted to a time by a voltage-to-time converter (VTC) 102, which is then converted to a digital signal (labeled "$D_{OUT}[k]$") by a time-to-digital converter (TDC) 104. In other words, a signal in the voltage domain is converted by the VTC 102 to a signal in the time domain, which is in turn converted by the TDC 104 to a signal in the digital domain. FIG. 1 provides a basic block diagram of a time-based ADC, but there may be additional components added that are not shown here, such as a feedback loop.

In an example time-based ADC pipeline stage, a voltage may be sampled on a capacitive digital-to-analog converter (DAC), converted to the time domain, and quantized. The quantization result may then be fed back to the capacitive DAC to generate a residue voltage that can be amplified and further quantized. So, the pipeline stage may carry out four functions sequentially: 1) voltage sampling, 2) voltage-to-time conversion, 3) time quantization, and 4) residue voltage generation. The faster each of these phases may be executed, the higher the maximum sampling rate. Accordingly, the time-based ADC pipeline stage benefits from low TDC latency in the time quantization stage. Design specifications may also call for a particular accuracy of the time-to-digital conversion. Linearity errors in the TDC may manifest as quantization errors, which may result in incorrect residue generation and potentially involve calibration. In this example, a small time quantization step (e.g., a fine time resolution), low latency, and good linearity are simultaneously desirable in a TDC.

As technologies have scaled, inverter delays have decreased, which has typically also improved the time resolution of the TDC. This can, in turn, be leveraged to improve the resolution and/or speed of time-based ADCs. In addition to the improved time resolution, the highly digital nature of TDCs (which are composed primarily of digital cells) has offered significant efficiency enhancements in deeply scaled complementary metal-oxide-semiconductor (CMOS) technology, such as in a 7 nm fin field-effect transistor (FinFET) process.

Example TDC

Figure 2A:
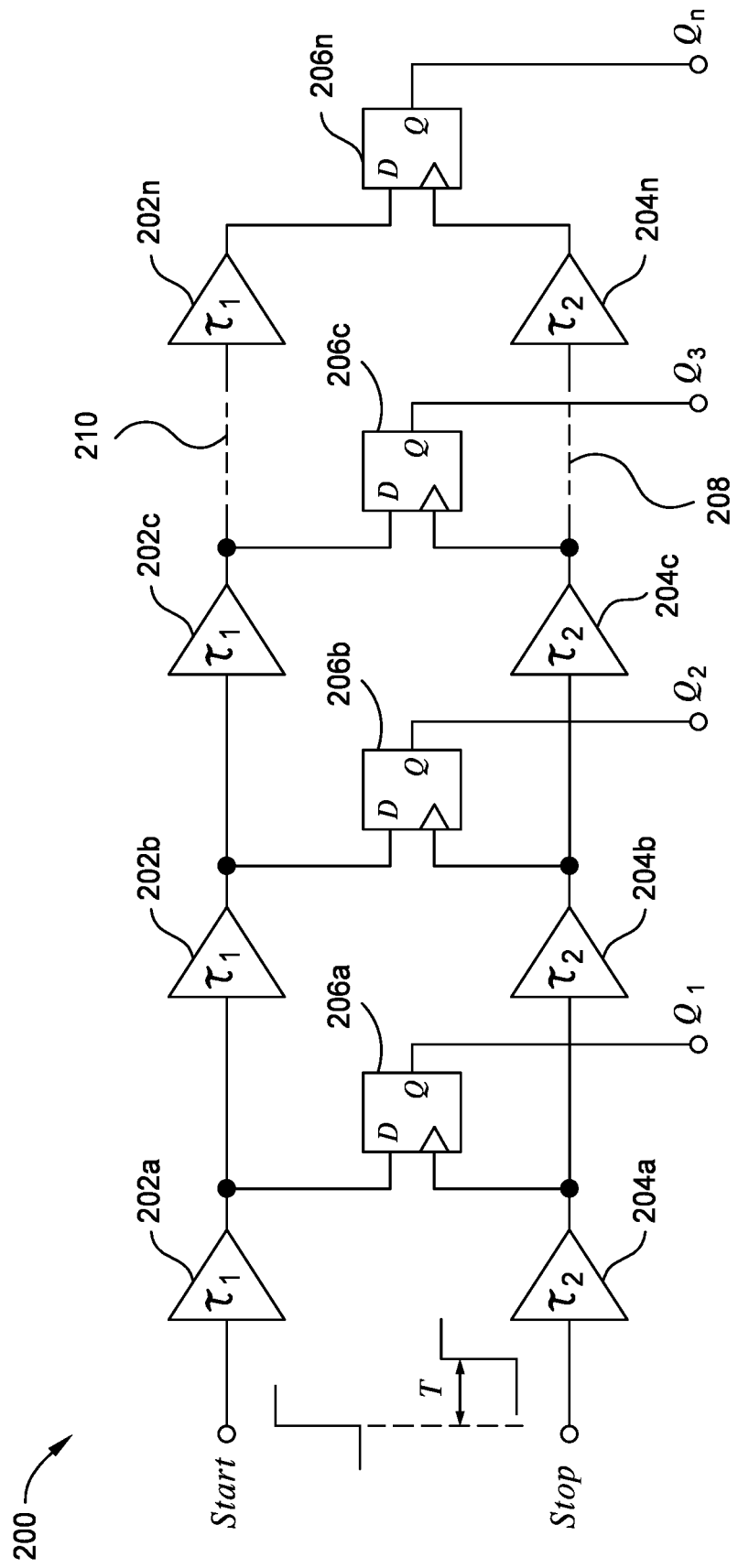
FIG. 2A is a block diagram of an example TDC with a single stop line.

As described above, time-to-digital converters (TDCs) are used (e.g., in time-based ADCs) to convert an input time to a digital output signal. FIG. 2A is a block diagram of an example TDC 200 with a single stop signal. This TDC 200 is sometimes referred to as a "Vernier TDC." In the TDC 200, both the start and stop signals are delayed, with multiple delay elements along each of the start and stop delay lines. A stop delay line with multiple delay elements is sometimes referred to as a "Vernier line."

The TDC 200 generally includes a first delay line 210 with a plurality of delay elements 202a, 202b, ..., 202n (collectively referred to herein as "delay elements 202"), a second delay line 208 with a plurality of delay elements 204a, 204b, ..., 204n (collectively referred to herein as "delay elements 204"), and a plurality of arbiters 206a, 206b, ..., 206n (collectively referred to herein as "arbiters 206"), where n is a positive integer. Although in FIG. 2A, at least four elements 202, at least four elements 204, and at least four arbiters 206 are shown as an example, the reader is to understand that there may be more or less than four elements 202, elements 204, and arbiters 206.

The TDC 200 may have a first input signal (labeled "Start") coupled to the first delay line 210, and a second input signal (labeled "Stop") coupled to the second delay line 208. A function of the TDC 200 may be to determine the time difference between the first input signal and the second input signal (e.g., the time between the rising edges of the start and stop pulses). To do so, the TDC 200 may first use the arbiters 206 to quantize increments of time, sometimes referred to as a "time step," by which to measure the time difference. The length (e.g., duration) of the time step defines the resolution of the TDC 200. The delay elements 204 may be configured to have a delay time that is less than a delay time of the delay elements 202 (e.g., time $\tau_2$ may be less than time $\tau_1$). As a result, as the first and second input signals pass through additional delay elements (202 and 204, respectively), the rising edge of the second input signal becomes incrementally closer to the rising edge of the first input signal, until eventually the rising edges overlap or the rising edge of the second input signal passes the rising edge of the first input signal (e.g., the second input signal "catches up" to the first input signal). The increments by which the first and second input signals become closer (e.g., the time step) may be calculated as the difference between time $\tau_1$ and time $\tau_2$. The time step may then be used to calculate the time difference between the rising edge of the first input signal and the rising edge of the second input signal, as explained in more detail below.

In an example, the delay element 202a may delay the first input signal by a time $\tau_1$, and the delay element 204a may delay the second input signal by a different time $\tau_2$, where $\tau_2$ is less than $\tau_1$. The arbiter 206a may then compare the delayed signals. Specifically, the rising edge of the first input signal may propagate along the first delay line 210 and set a first data input of each of the arbiters 206 (e.g., D flip-flops), and the rising edge of the second input signal may propagate along the second delay line 208 and set a second data input of each of the arbiters 206 which latches the state of the delay line 210.

The delay element 202b may further delay the first input signal by an additional time $\tau_1$ and the delay element 204b may delay the second input signal by an additional time $\tau_2$. The arbiter 206b may then latch the state of the delay line 210 at the output of the delay element 202b. These steps may be performed by subsequent delay elements and arbiters until one of the arbiters 206 is not latched (e.g., the arbiter receives the delayed second input signal before receiving the delayed first input signal). The outputs Q1, Q2, ..., Qn of the arbiters 206 may provide the location of the first arbiter 206 which was not set.

The TDC 200 may then calculate the time difference between the first input signal and the second input signal based on the outputs of the arbiters 206. Specifically, the TDC 200 may determine the time difference by multiplying the time step by the number of arbiters 206 that were set. For example, if the difference between time $\tau_1$ and time $\tau_2$ is 10 ps, and the first and second input signals pass through six delay stages before one of the arbiters 206 is not set, then the time difference between the rising edges of the first and second input signals would be six times the time step, or 60 ps.

Figure 2B:
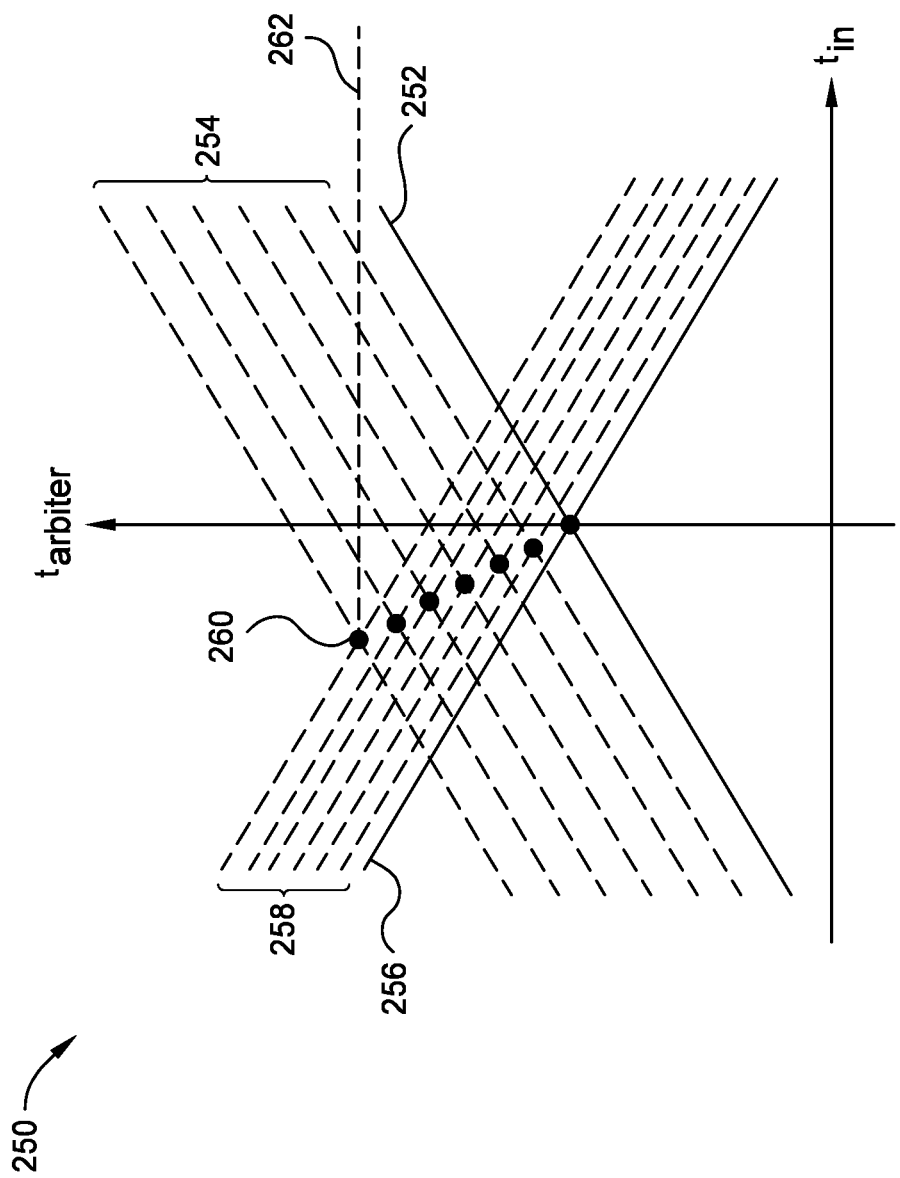
FIG. 2B is a graph illustrating the times at which an arbiter in each stage of the TDC of FIG. 2A compares the signal along the start line with the signal along the stop line.

FIG. 2B is a graph 250 illustrating the times at which the arbiters 206 of FIG. 2A compare the signal along the first delay line 210 with the signal along the second delay line 208. The x-axis (labeled "$t_{in}$") represents the differential input time between the first and second input signals, and the y-axis (labeled "$t_{arbiter}$") represents times at which the arbiter at each stage performs the comparison of the delayed versions of the first and second input signals.

Line 252 may represent the first input signal (e.g., "Start") and line 256 may represent the second input signal (e.g., "Stop"). Moreover, the lines 254 may represent the delayed versions of the first input signal, and the lines 258 may represent the delayed versions of the second input signal. The distances between adjacent lines 254 (and the line 252) represent the delay time $\tau_1$ of each delay element 202 in the first delay line 210, and the distances between adjacent lines 258 (and the line 256) represent the delay time $\tau_2$ of each delay element 204 in the second delay line 208. Each of the arbiters 206 will be triggered to perform a comparison of a delayed version of the first and second input signals at a time when both signals reach the stage including that stage's arbiter. Accordingly, each of the points on the graph 250 at which the respective delayed lines cross each other represents a decision point at which time the respective arbiter makes the comparison.

For example, point 260 may represent a time at which an arbiter of the TDC 200 (e.g., the arbiter 206n) performs the final comparison of the delayed first and second input signals. As shown, the point 260 is located at a time 262 along the y-axis, which represents the time at which the final comparison was performed. The time 262 may, therefore, be said to represent the latency of the TDC 200.

While the TDC 200 may provide a relatively linear TDC architecture, the TDC 200 suffers from increased latency since both input signals are subject to delays. While in some applications this latency is acceptable, some applications specify a reduced latency. For example, in the case of a time-based quantizer in a voltage-based ADC pipeline stage, reduced latency is desirable.

Accordingly, a TDC architecture that simultaneously achieves good time resolution, low latency, and good linearity is desirable.

Example TDC with Multiple Stop Lines

Figure 3A:
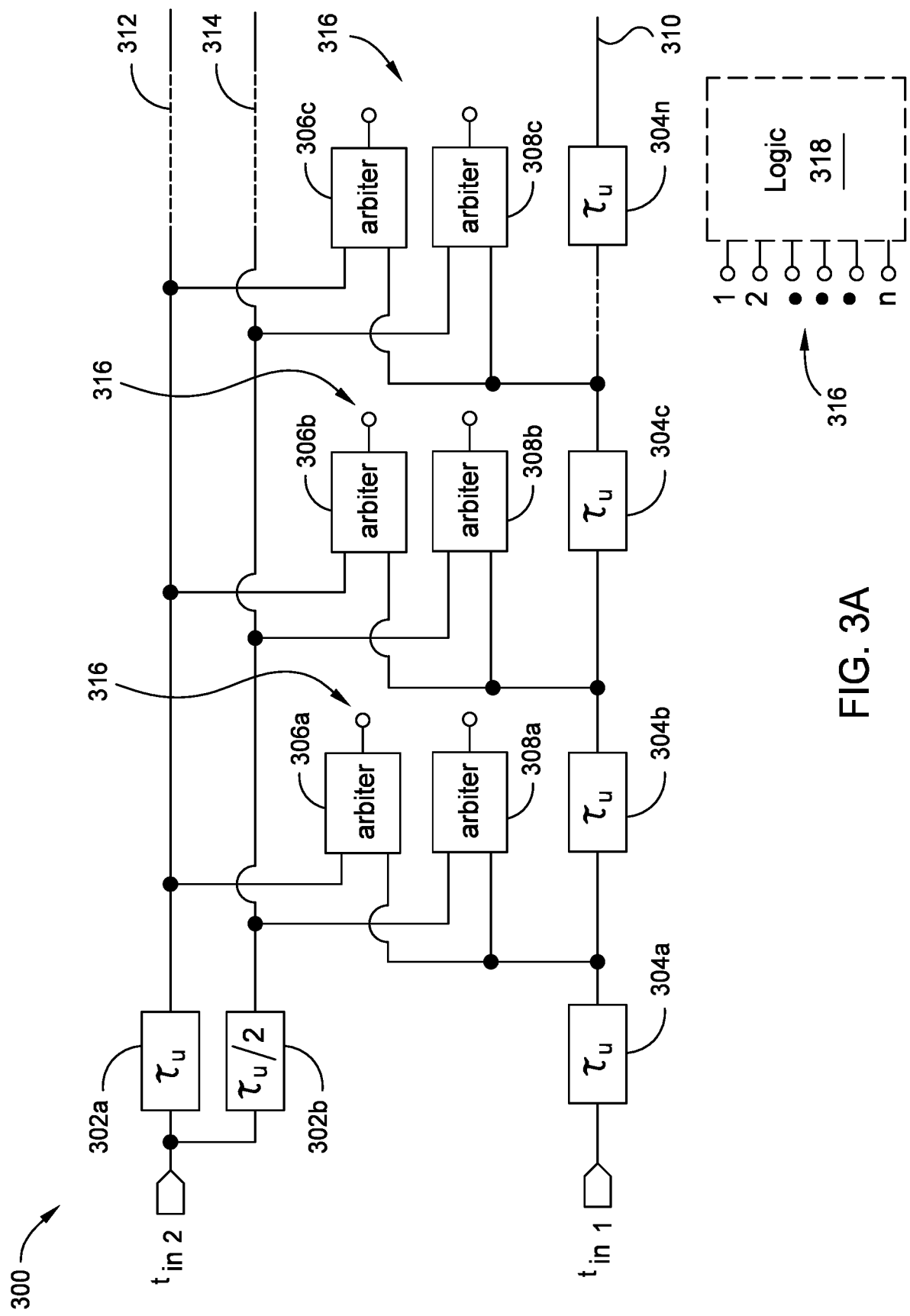
FIG. 3A is a block diagram of an example TDC with two stop lines and two sets of arbiters, according to some examples of the present disclosure.

Examples of the present disclosure provide TDC architectures with multiple stop lines and multiple sets of arbiters at each delay stage. The multiple stop lines and multiple sets of arbiters provide reduced quantization latency, without penalizing resolution or linearity. FIG. 3A is a block diagram of an example TDC 300 with two stop lines 312 and 314, according to some examples of the present disclosure.

The TDC 300 may be similar to the TDC 200 in that a signal at a first input (labeled "$t_{in1}$," also referred to as the "start signal") may be delayed by a number n of delay elements 304a, 304b, . . . , 304n (collectively referred to herein as "delay elements 304") of a first delay line 310, each adding a unit delay $T_u$ to the first input signal, where n is a positive integer. However, unlike the TDC 200, the output of each of the delay elements 304 of the TDC 300 may be coupled to a first input of two sets of arbiters 306a, 306b, . . . , 306n (collectively referred to herein as a "first set of arbiters 306" or "arbiters 306") and 308a, 308b, . . . , 308n (collectively referred to herein as a "second set of arbiters 308" or "arbiters 308"). That is, each of the arbiters 306 (and each of the arbiters 308) may have a first input coupled to a different tap of the first delay line 310.

Additionally, unlike the TDC 200, the TDC 300 may have a second input with a second input signal (labeled "$t_{in2}$," also referred to as the "stop signal") coupled to a second delay line 312 with a single delay element 302a. Because of the single delay element 302a, the second delay line 312 may simply be considered as the output of the delay element 302a, where an input of the delay element 302a is coupled to the second input of the TDC 300. In some examples, the delay element 302a may have a delay time equal to the delay time (e.g., $T_u$) of the delay elements 304 of the first delay line 310. The TDC 300 may also have a third delay line 314 coupled to the second input. In some examples, the third delay line 314 may have a single delay element 302b having a second delay time (e.g., $T_u/2$). In some examples, the delay time of the delay element 302b may be smaller than the delay time of the other delay elements 304 and 302a. Because of the single delay element 302b, the third delay line 314 may simply be considered as the output of the delay element 302b, where an input of the delay element 302b is coupled to the second input of the TDC 300. In some examples, the delay time of the delay element 302b may be approximately half of the delay time of the other delay elements 304 and 302a. For other examples, a delay difference between the outputs of the delay element 302a and the delay element 302b is one-half of the delay time of the delay elements 304. In some examples, delay element 302a may be configured to have half the delay time of the delay elements 304, while the delay of delay element 302b is set to zero (i.e., effectively omitted) by connecting the second input signal $t_{in2}$ directly to the second set of arbiters 308. By having one delay element (e.g., 302a and 302b) for each stop delay line (312 and 314), instead of one at each arbiter stage as was the case in the TDC 200, the total number of delay elements in the TDC is reduced, thereby reducing power and area consumption.

As shown, in addition to having first inputs coupled to different taps of the first delay line 310, the first set of arbiters 306 may have second inputs coupled to the second delay line 312. Similarly, the second set of arbiters 308 may have first inputs coupled to the different taps of the first delay line 310 and second inputs coupled to the third delay line 314.

In some examples, the delay elements 304, 302a, and/or 302b may be implemented by complementary metal-oxide-semiconductor (CMOS) buffers. In some examples, the arbiters 306 and/or 308 may be implemented by delay (D) flip-flops.

In some examples, the TDC 300 may optionally include logic 318 that has inputs (labeled "1, 2, . . . , n") coupled to outputs 316 of the first and second sets of arbiters 306, 308. In some examples, the logic 318 may be configured to output a digital signal (e.g., $D_{OUT}[k]$) based on a time difference between the first input signal (e.g., "$t_{in1}$") of the TDC 300 and the second input signal (e.g., "$t_{in2}$") of the TDC 300, as determined by the outputs 316 of the multiple sets of arbiters along the tapped delay lines. For ease of illustration, other figures of the present application do not include a logic block. However, a person of ordinary skill in the art will appreciate that other TDCs discussed herein (e.g., TDC 400, discussed below with respect to FIG. 4A) may include a logic block similar to logic 318.

Figure 3B:
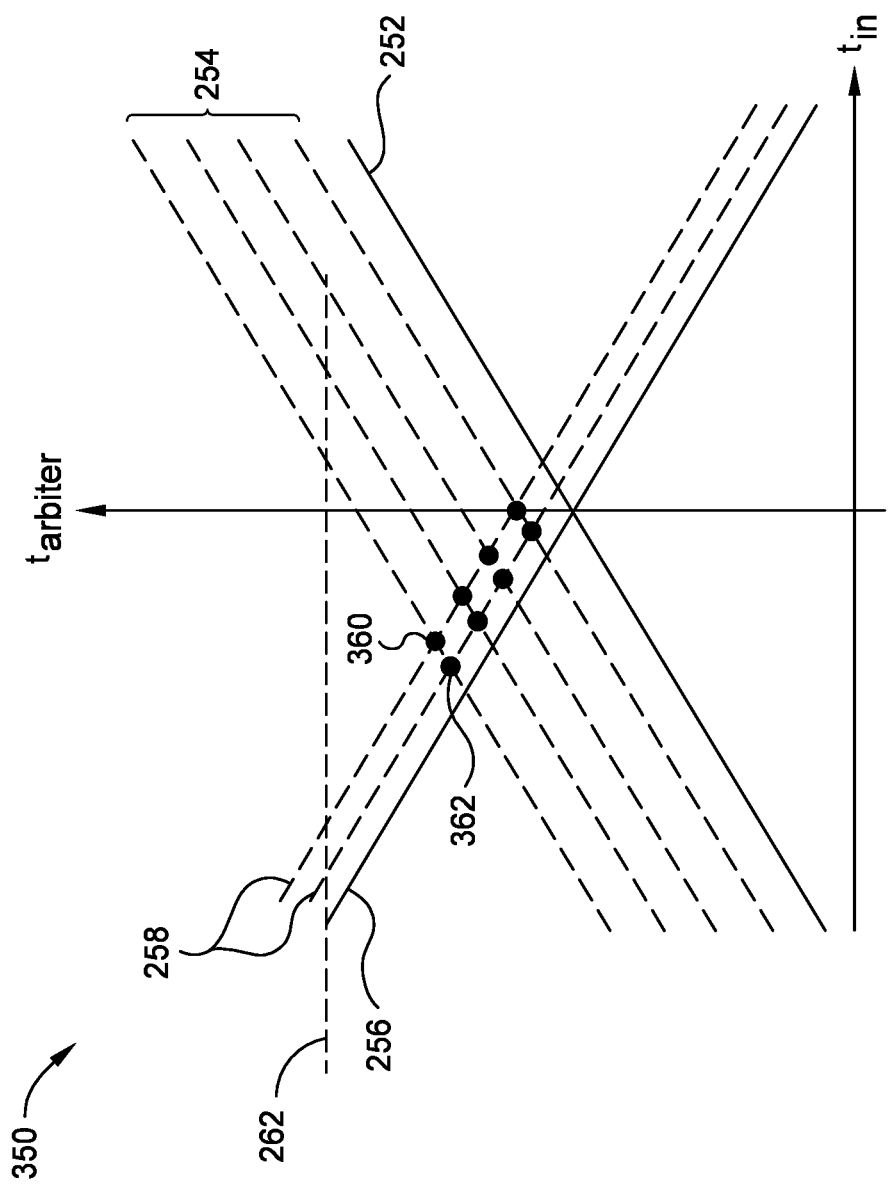
FIG. 3B is a graph illustrating the times at which the arbiters in each stage of the TDC of FIG. 3A compare the signal along the start line with signals along each of the two stop lines.

FIG. 3B is a graph 350 illustrating the times at which the arbiters 306 and 308 of FIG. 3A compare the signal along the first delay line 310 with the signals along the second delay line 312 and the third delay line 314, respectively. An explanation of the information represented by the axes and lines is provided above with respect to FIG. 2B and will not be repeated here.

Each of the arbiters 306 and 308 will be triggered to perform a comparison of a delayed version of the first and second input signals at the time when both signals reach the stage including that arbiter. Accordingly, the points on the graph 350 at which the respective delayed lines cross each other represents a decision point at which time the respective arbiter makes the comparison.

Because the second input signal is passed through two different delay elements (e.g., 302a and 302b) having two different delay times (e.g., $T_u$ and $T_u/2$, respectively), and because the outputs of the two delay elements are each coupled to different sets of arbiters (e.g., 306 and 308, respectively), the two sets of arbiters may perform comparisons at times that are spaced apart by time $T_u/2$. Additionally, the TDC 300 only delays the second signal once by each of the two delay elements 302a and 302b, instead of several times as done by the delay elements 204 of the TDC 200. As a result, the TDC 300 may have a reduced latency compared to the latency of the TDC 200 of FIG. 2A (represented by the line for time 262), as illustrated in FIG. 3B.

As an example, point 360 may represent a time at which the arbiter 306c performs a comparison of the delayed first signal at the output of the delay element 304c, and the delayed second input signal of the second delay line 312. Moreover, point 362 may represent a time at which the arbiter 308c performs a comparison of the delayed first signal at the output of the delay element 304c, and the delayed second input signal of the third delay line 314.

As shown, each comparison point (including points 360 and 362) is located at a time along the y-axis that is lower than the time 262, indicating that the arbiters of the TDC 300 are able to perform the final comparison of the delayed first and second input signals before the arbiters of the TDC 200. Accordingly, the TDC 300 has a reduced latency compared to the TDC 200.

Figure 4A:
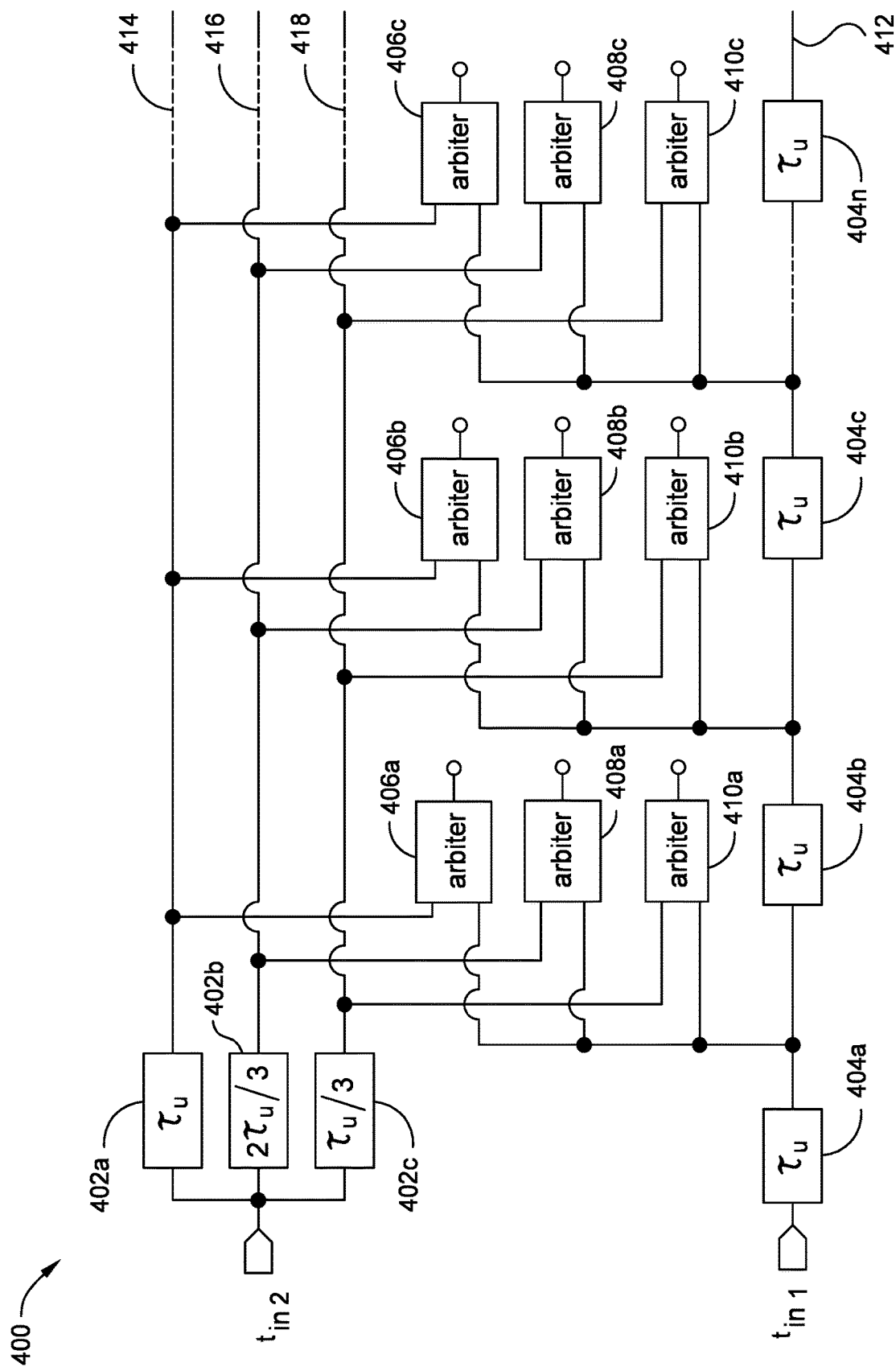
FIG. 4A is a block diagram of an example TDC with three stop lines and three sets of arbiters, according to some examples of the present disclosure.

FIG. 4A is a block diagram of an example TDC 400, according to some examples of the present disclosure. The TDC 400 may be similar to the TDC 300, but with an additional stop line and an additional set of arbiters. The TDC 400 may have a first delay line 412 coupled to a first input of the TDC 400 with a first input signal (labeled "$t_{in1}$"). As shown, the output of each of delay elements 404a, 404b, 404n (collectively referred to herein as "delay elements 404") along the first delay line 412 (coupled to a first input of the TDC 400 may be coupled to a first input of three sets of time arbiters 406a, 406b, . . . , 406n (collectively referred to herein as a "first set of arbiters 406" or "arbiters 406"), 408a, 408b, . . . , 408n (collectively referred to herein as a "second set of arbiters 408" or "arbiters 408"), and 410a, 410b, . . . , 410n (collectively referred to herein as a "third set of arbiters 410" or "arbiters 410"). That is, each of the arbiters 406 (and each of the arbiters 408 and 410) may have a first input coupled to a different tap of the first delay line 412.

Similar to the TDC 300, the TDC 400 may have a second delay line 414 with a single delay element 402a coupled to a second input of the TDC 400 with a second input signal (labeled "$t_{in2}$"). In some examples, the delay element 402a may have a delay time equal to the delay time (e.g., $\tau_u$) of the delay elements 404 of the first delay line 412. The TDC 400 may also have a third delay line 416, including a third delay element 402b, coupled to the second input of the TDC. In some examples, the third delay element 402b may have a second delay time (e.g., $2\tau_u/3$). In some examples, the delay time of the delay element 402b may be smaller than the delay time of the delay elements 404 and 402a. In some examples, the delay time of the delay element 402b may be approximately two-thirds of the delay time of the other delay elements 404 and 402a.

Additionally, the TDC 400 may have a fourth delay line 418 coupled to the second input of the TDC, the fourth delay line 418 including a fourth delay element 402c. In some examples, the fourth delay element 402c may have a third delay time (e.g., $\tau_u/3$). In some examples, the delay time of the delay element 402c may be smaller than the delay time of the delay elements 404, 402a, and 402b. In some examples, the delay time of the delay element 402c may be approximately one-third of the delay time of the delay elements 404 and 402a, and approximately one-half of the delay time of the delay element 402b. Because of the single delay element 402a, 402b, 402c in each associated delay line, the second, third, and fourth delay lines 414, 416, 418 may simply be considered as the outputs of the delay elements 402a, 402b, 402c, respectively, where an input of each of the delay elements 402a, 402b, 402c is coupled to the second input of the TDC 400.

In some examples, the delay elements 404 and/or 402a-c may be implemented by complementary metal-oxide-semiconductor (CMOS) buffers. In some examples, the arbiters 406, 408, and/or 410 may be implemented by delay flip-flops.

According to some examples, the TDC 400 may also include logic (not shown) that has inputs coupled to outputs of the first set of arbiters 406, to outputs of the second set of arbiters 408, and to outputs of the third set of arbiters 410. In some examples, the logic may be configured to output a digital signal (e.g., $D_{OUT}[k]$) based on a time difference between a first signal at the first input (e.g., "$t_{in1}$") of the TDC 400 and a second signal at the second input (e.g., "$t_{in2}$") of the TDC 400.

Figure 4B:
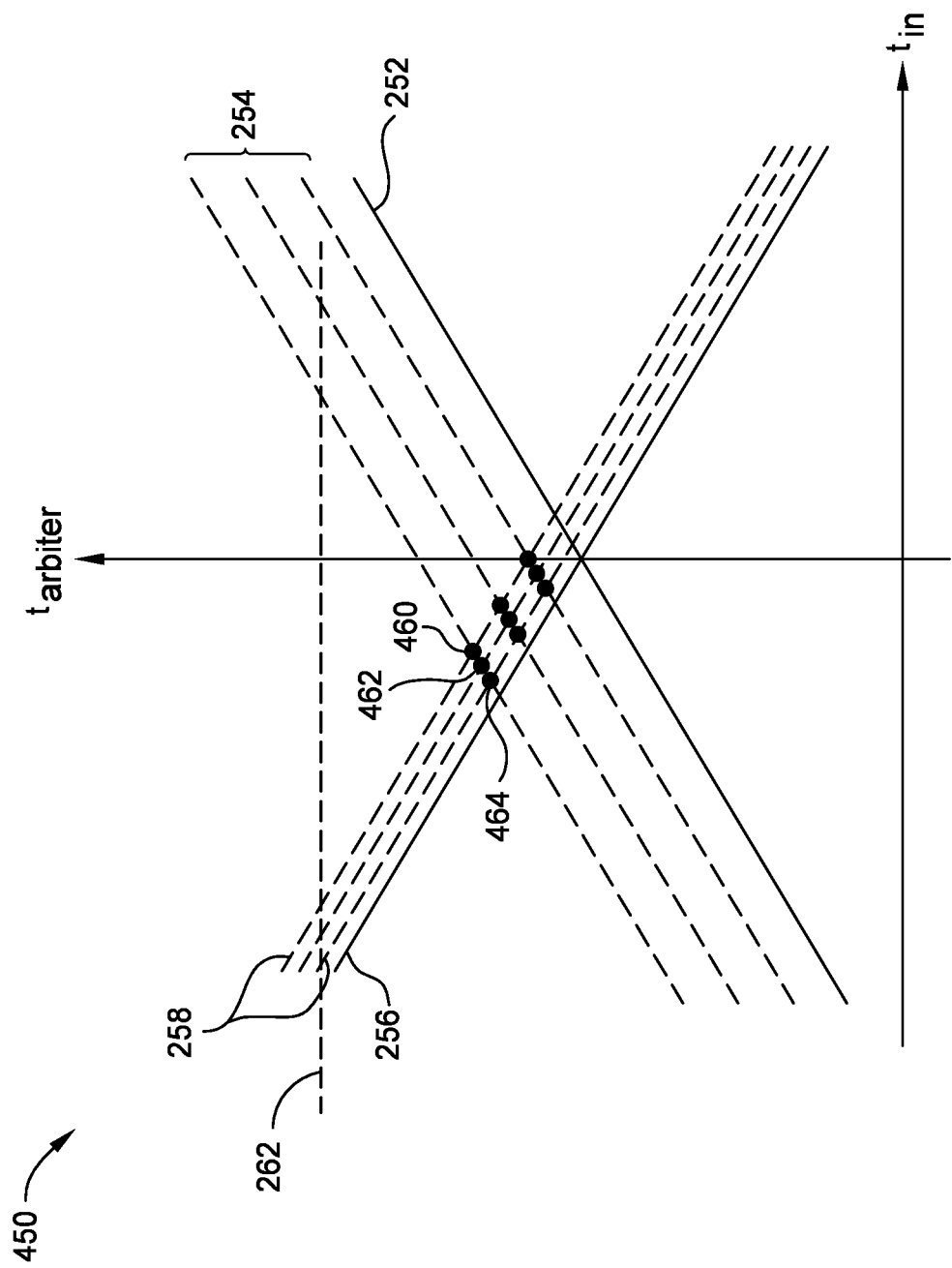
FIG. 4B is a graph illustrating the times at which the arbiters in each stage of the TDC of FIG. 4A compare the signal along the start line with the signals along each of the three stop lines.

FIG. 4B is a graph 450 illustrating the times at which the arbiters 406, 408, and 410 of FIG. 4A compare the signal along the first delay line 412 with the signals along second delay line 414, the third delay line 416, and the fourth delay line 418, respectively. An explanation of the information represented by the axes and lines is provided above with respect to FIG. 2B and will not be repeated here.

Each of the arbiters 406, 408, and 410 will be triggered to perform a comparison of a delayed version of the first and second input signals at the time when both signals reach the stage including that arbiter. Accordingly, each of the points on the graph 450 at which the respective delayed lines cross each other represents a decision point at which time the respective arbiter makes the comparison.

As illustrated in FIG. 4B, the TDC 300 may have a reduced latency compared to the latency of the TDC 200 of FIG. 2A (represented by the line for time 262).

As an example, point 460 may represent a time at which the arbiter 406c performs a comparison of the delayed first signal and the delayed second input signal along the second delay line 414. Moreover, point 462 may represent a time at which the arbiter 408c performs a comparison of the delayed first signal and the delayed second input signal along the third delay line 416; and point 464 may represent a time at which the arbiter 410c performs a comparison of the delayed first signal and the delayed second input signal along the fourth delay line 418.

As shown, each comparison point (including points 460, 462, and 464) is located at a time along the y-axis that is lower than the time 262, indicating that the arbiters of the TDC 400 are able to perform the final comparison of the delayed first and second input signals before the arbiters of the TDC 200. Accordingly, the TDC 400 has a reduced latency compared to the TDC 200.

Example Conversion Operations

Figure 5:
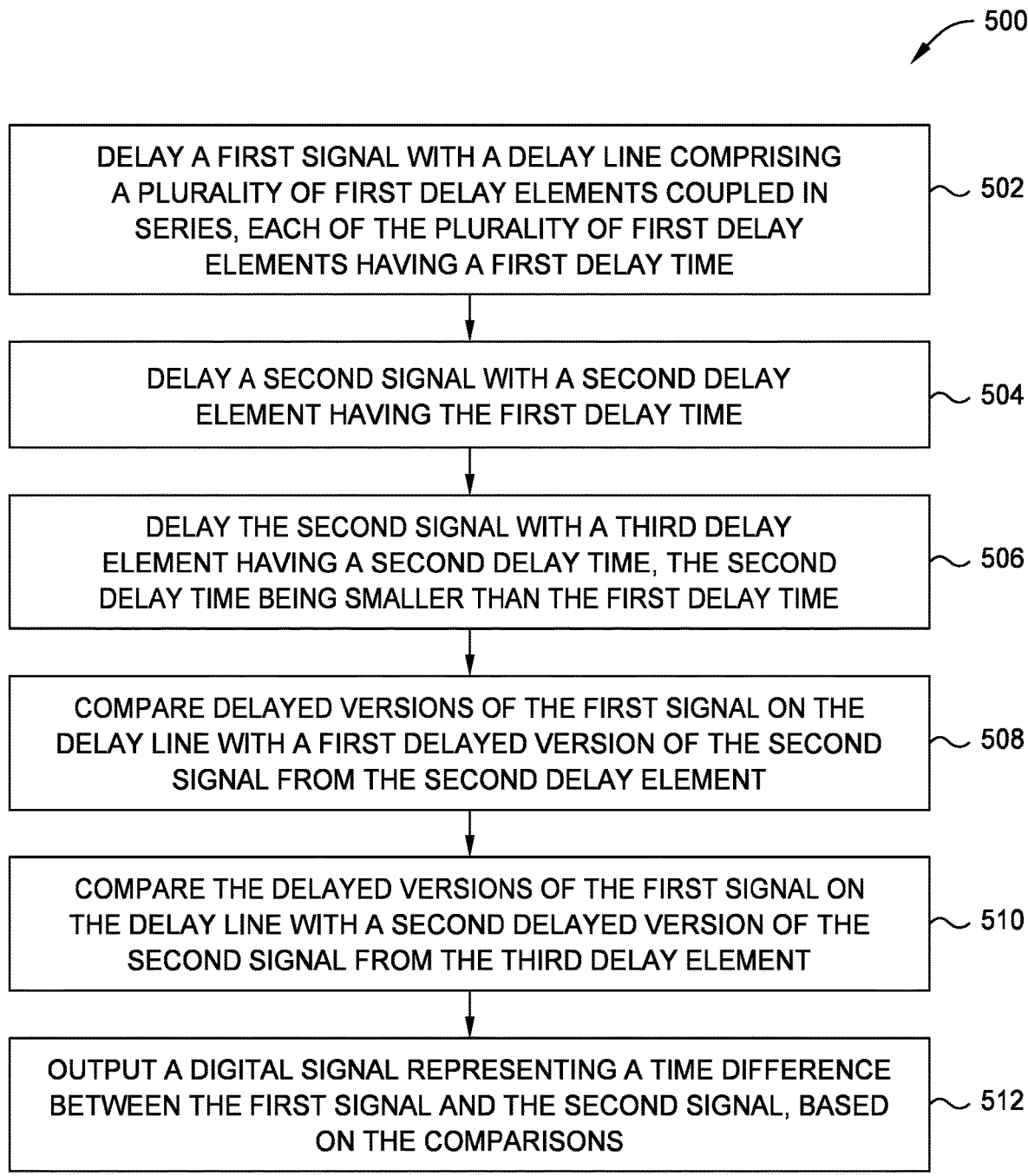
FIG. 5 is a flow diagram of example operations for time-to-digital conversion, according to some examples of the present disclosure.

FIG. 5 is a flow diagram of example operations 500 for time-to-digital conversion, according to some examples of the present disclosure. The operations 500 may be performed by a time-to-digital converter (TDC) (e.g., the TDC 300 of FIG. 3A or the TDC 400 of FIG. 4A). The flow diagram includes blocks representing the operations 500.

The operations 500 may begin, at block 502, with the TDC delaying a first signal (e.g., a start signal) with a delay line (e.g., first delay line 310 or 412). The delay line may include a plurality of first delay elements (e.g., delay elements 304 or 404) coupled in series, each of the plurality of first delay elements having a first delay time (e.g., $\tau_u$). At block 504; the TDC may delay a second signal with a second delay element (e.g., delay element 302a or 402a) having the first delay time. At block 506, the TDC may delay the second signal with a third delay element (e.g., delay element 302b) having a second delay time (e.g., $\tau_u/2$ or $2\tau_u/3$), the second delay time being smaller than the first delay time. In some examples, the second delay time may be one-half of the first delay time. In other examples, a delay difference between outputs of the second delay element and the third delay element may be one-half of the delay time of the first delay elements.

At block 508, the TDC may compare delayed versions of the first signal on the delay line with a first delayed version of the second signal from the second delay element. At block 510, the TDC may compare the delayed versions of the first signal on the delay line with a second delayed version of the second signal from the third delay element. At block 512, the TDC may output a digital signal (e.g., $D_{OUT}[k]$) representing a time difference between the first signal and the second signal, based on the comparisons.

According to some examples, comparing the delayed versions of the first signal on the delay line with the first delayed version of the second signal from the second delay element may involve using a first set of arbiters (e.g., arbiters 306 or 406) having first inputs coupled to the delay line and having second inputs coupled to (an output of) the second delay element. In some examples, comparing the delayed versions of the first signal on the delay line with the second delayed version of the second signal from the third delay element may involve using a second set of arbiters (e.g., arbiters 308 or 408) having first inputs coupled to the delay line and having second inputs coupled to (an output of) the third delay element.

According to some examples, the operations 500 may further include delaying the second signal with a fourth delay element (e.g., delay element 402c) having a third delay time (e.g., $\tau_D/3$), and comparing the delayed versions of the first signal on the delay line with a third delayed version of the second signal from the fourth delay element. In this case, comparing the delayed versions of the first signal on the delay line with the third delayed version of the second signal from the fourth delay element may involve using a set of arbiters (e.g., arbiters 410) having first inputs coupled to the delay line and having second inputs coupled to (an output of) the fourth delay element. In some examples, the third delay time may be smaller than the second delay time. In some examples, the third delay time may be one-third of the first delay time and the second delay time may be two-thirds of the first delay time.

Example Programmable Integrated Circuits

The time-to-digital converters (TDCs) described herein may be implemented in a time-based analog-to-digital converter (ADC), for example. A time-based ADC may be included in any of various suitable devices or systems, such as an integrated circuit (IC) or module.

One type of IC that may utilize one or more time-based ADCs and/or one or more TDCs is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

Figure 6:
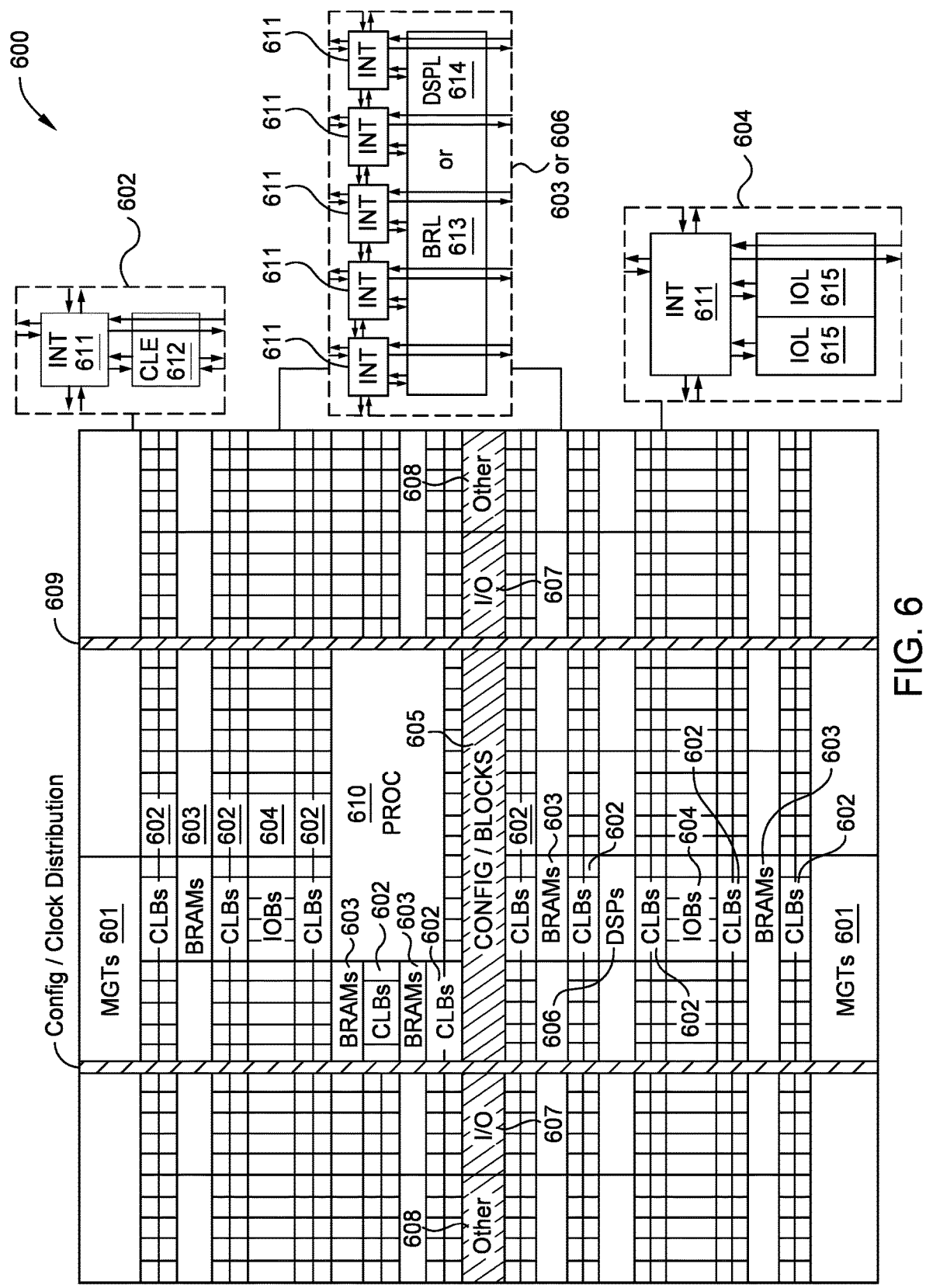
FIG. 6 is a block diagram illustrating an example architecture for a programmable device, in which some examples of the present disclosure may be practiced.

FIG. 6 is a block diagram illustrating an architecture for an example programmable device 600. The architecture may be implemented within a field programmable gate array (FPGA), for example. As shown, the programmable device 600 includes several different types of programmable circuitry (e.g., logic blocks). For example, the programmable device 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized I/O blocks 607 (e.g., configuration ports and clock ports), and other programmable logic 608, such as digital clock managers, analog-to-digital converters (ADCs), system monitoring logic, and the like. For some examples, one or more ADCs of the programmable device 600 may include a time-based ADC, which may include the time-to-digital converter (TDC) described herein.

In some FPGAs, each programmable tile includes a programmable interconnect element (INT) 611 having standardized connections to and from a corresponding INT 611 in each adjacent tile. Therefore, the INTs 611, taken together, implement the programmable interconnect structure for the illustrated FPGA. Each INT 611 also includes the connections to and from the programmable logic element within the same tile, as shown by the examples included at the far right of FIG. 6.

For example, a CLB 602 may include a configurable logic element (CLE) 612 that can be programmed to implement user logic plus a single INT 611. A BRAM 603 may include a BRAM logic element (BRL) 613 in addition to one or more INTs 611. Typically, the number of INTs 611 included in a tile depends on the width of the tile. In the pictured example, a BRAM tile has the same width as five CLBs, but other numbers (e.g., four) can also be used. A DSP block 606 may include a DSP logic element (DSPL) 614 in addition to an appropriate number of INTs 611. An IOB 604 may include, for example, two instances of an I/O logic element (IOL) 615 in addition to one instance of an INT 611. As will be clear to a person having ordinary skill in the art, the actual I/O pads connected, for example, to the IOL 615 typically are not confined to the area of the IOL 615.

In the example programmable device 600 depicted in FIG. 6, a horizontal area near the center of the die (shown shaded in FIG. 6) is used for configuration, clock, and other control logic (CONFIG/CLOCKS 605). Other vertical areas 609 extending from this central area may be used to distribute the clocks and configuration signals across the breadth of the device.

Some FPGAs utilizing the architecture illustrated in FIG. 6 include additional logic blocks that disrupt the regular row structure making up a large part of the FPGA. The additional logic blocks may be programmable blocks and/or dedicated circuitry. For example, a processor block depicted as PROC 610 spans several rows of CLBs 602 and BRAMs 603.

The PROC 610 may be implemented as a hard-wired processor that is fabricated as part of the die that implements the programmable circuitry of the FPGA. The PROC 610 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 610 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 6 that are external to the PROC 610 may be considered part of the, or the, programmable circuitry of the FPGA.

FIG. 6 is intended to illustrate an example architecture that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 6 are exemplary. In an actual FPGA, for example, more than one adjacent row of CLBs 602 is typically included wherever the CLBs appear, in an effort to facilitate the efficient implementation of a user circuit design. The number of adjacent CLB rows, however, can vary with the overall size of the FPGA. Further, the size and/or positioning of the PROC 610 within the FPGA is for purposes of illustration only and is not intended as a limitation of the one or more examples of the present disclosure.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

For example, means for delaying a signal may include one or more delay elements, such as the delay elements 302a, 302b, and/or 304 depicted in FIG. 3A or the delay elements 402a, 402b, 402c, and/or 404 illustrated in FIG. 4A, Means for comparing signals may include one or more arbiters, such as the arbiters 306 and/or 308 portrayed in FIG. 3A or the arbiters 406, 408, and/or 410 shown in FIG. 4A. Means for outputting a digital signal may include logic, such as logic 318.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A device comprising a time-to-digital converter (TDC), the TDC comprising:
   a first input;
   a second input;
   a delay line coupled to the first input and comprising a plurality of first delay elements coupled in series, each of the plurality of first delay elements having a first delay time;
   a second delay line comprising a second delay element, the second delay element having the first delay time and coupled to the second input;
   a third delay line comprising a third delay element, the third delay element having a second delay time and coupled to the second input, the second delay time being smaller than the first delay time;
   a first set of arbiters, each arbiter in the first set of arbiters having a first input coupled to one of the plurality of first delay elements of the delay line and having a second input coupled to the second delay element; and
   a second set of arbiters, each arbiter in the second set of arbiters having a first input coupled to one of the plurality of first delay elements of the delay line and having a second input coupled to the third delay element.

2. The device of claim 1, wherein the second delay time is one-half of the first delay time.

3. The device of claim 1, wherein the plurality of first delay elements, the second delay element, and the third delay element comprise complementary metal-oxide-semiconductor (CMOS) buffers.

4. The device of claim 1, wherein the first set of arbiters and the second set of arbiters comprise delay flip-flops.

5. The device of claim 1, wherein:
   each of the first set of arbiters has a first input coupled to a different tap of the delay line and has a second input coupled to an output of the second delay element; and
   each of the second set of arbiters has a first input coupled to the different tap of the delay line and has a second input coupled to an output of the third delay element.

6. The device of claim 1, further comprising:
   a fourth delay element having a third delay time and coupled to the second input; and
   a third set of arbiters having first inputs coupled to the delay line and having second inputs coupled to the fourth delay element.

7. The device of claim 6, wherein the third delay time is smaller than the second delay time.

8. The device of claim 6, wherein the third delay time is one-third of the first delay time and wherein the second delay time is two-thirds of the first delay time.

9. The device of claim 1, further comprising logic having inputs coupled to outputs of the first set of arbiters and to outputs of the second set of arbiters, the logic being configured to output a digital signal based on a time difference between a first signal at the first input of the TDC and a second signal at the second input of the TDC.

10. The device of claim 1, wherein the device comprises a time-based analog-to-digital converter (ADC), wherein the time-based ADC comprises a voltage-to-time converter (VTC) and the TDC, and wherein a differential output pair of the VTC is coupled to the first input and the second input of the TDC.

11. A method of time-to-digital conversion, comprising:
delaying a first signal with a delay line comprising a plurality of first delay elements coupled in series, each of the plurality of first delay elements having a first delay time;
delaying a second signal with a second delay line comprising a second delay element having the first delay time;
delaying the second signal with a third delay line comprising a third delay element having a second delay time, the second delay time being smaller than the first delay time;
comparing a delayed version of the first signal from a first delay element on the delay line with a first delayed version of the second signal from the second delay element;
comparing the delayed version of the first signal from a first delay element on the delay line with a second delayed version of the second signal from the third delay element; and
outputting a digital signal representing a time difference between the first signal and the second signal, based on the comparisons.

12. The method of claim 11, wherein:
comparing the delayed version of the first signal on the delay line with the first delayed version of the second signal from the second delay element comprises using a first set of arbiters having first inputs coupled to the delay line and having second inputs coupled to an output of the second delay element; and
comparing the delayed version of the first signal on the delay line with the second delayed version of the second signal from the third delay element comprises using a second set of arbiters having first inputs coupled to the delay line and having second inputs coupled to an output of the third delay element.

13. The method of claim 11, wherein the second delay time is one-half of the first delay time.

14. The method of claim 11, further comprising:
delaying the second signal with a fourth delay element having a third delay time; and
comparing the delayed version of the first signal on the delay line with a third delayed version of the second signal from the fourth delay element.

15. The method of claim 14, wherein comparing the delayed version of the first signal on the delay line with the third delayed version of the second signal from the fourth delay element comprises using a set of arbiters having first inputs coupled to the delay line and having second inputs coupled to an output of the fourth delay element.

16. The method of claim 14, wherein the third delay time is smaller than the second delay time.

17. The method of claim 14, wherein the third delay time is one-third of the first delay time and wherein the second delay time is two-thirds of the first delay time.

18. A time-to-digital converter (TDC) comprising:
a first input;
a second input;
a delay line coupled to the first input and comprising a plurality of first delay elements coupled in series, each of the plurality of first delay elements having a delay time;
a plurality of delay lines comprising second delay elements having a first output, a second output, and at least one input coupled to the second input;
a first set of arbiters having first inputs, each first arbiter coupled to a first delay element in the delay line and having second inputs coupled to the first output of the plurality of second delay elements; and
a second set of arbiters having first inputs, each first arbiter coupled to a first delay element in the delay line and having second inputs coupled to the second output of the plurality of second delay elements, wherein a delay difference between the first output and the second output of the plurality of second delay elements is one-half of the delay time.

19. The TDC of claim 18, further comprising a third set of arbiters, wherein:
the plurality of second delay elements comprises a third output; and
the third set of arbiters has first inputs coupled to the delay line and has second inputs coupled to the third output of the plurality of second delay elements.

* * * * *